United States Patent
Lee et al.

(10) Patent No.: US 11,063,735 B2
(45) Date of Patent: Jul. 13, 2021

(54) ELECTRONIC DEVICE FOR REDUCING NOISE IN FREQUENCY BAND OF RX SIGNAL AND METHOD FOR THE SAME

(71) Applicant: Samsung Electronics Co., Ltd., Gyeonggi-do (KR)

(72) Inventors: Hanyeop Lee, Gyeonggi-do (KR); Dongil Yang, Gyeonggi-do (KR); Hyoseok Na, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/701,583

(22) Filed: Dec. 3, 2019

(65) Prior Publication Data
US 2020/0228300 A1 Jul. 16, 2020

(30) Foreign Application Priority Data
Jan. 15, 2019 (KR) .................. 10-2019-0005256

(51) Int. Cl.
*H04L 5/14* (2006.01)
*H04B 1/00* (2006.01)
*H04B 1/44* (2006.01)

(52) U.S. Cl.
CPC ......... *H04L 5/1461* (2013.01); *H04B 1/0057* (2013.01); *H04B 1/44* (2013.01)

(58) Field of Classification Search
CPC ........ H04L 5/1461; H04B 1/0057; H04B 1/44
See application file for complete search history.

(56) References Cited

U.S. PATENT DOCUMENTS

| | | |
|---|---|---|
| 2010/0323641 A1 | 12/2010 | Aparin et al. |
| 2014/0194071 A1 | 7/2014 | Wyville |
| 2015/0326463 A1* | 11/2015 | Solondz .................. H04L 43/12 370/252 |
| 2016/0261295 A1 | 9/2016 | Astrom et al. |
| 2018/0123617 A1 | 5/2018 | Huang et al. |
| 2018/0191537 A1 | 7/2018 | Xiong et al. |
| 2020/0259465 A1* | 8/2020 | Wu ...................... H04B 1/0475 |

FOREIGN PATENT DOCUMENTS

| | | |
|---|---|---|
| EP | 3229375 A1 | 10/2017 |
| WO | 2017/092399 A1 | 6/2017 |

OTHER PUBLICATIONS

International Search Report dated Mar. 9, 2020.

* cited by examiner

*Primary Examiner* — Brian P Cox
(74) *Attorney, Agent, or Firm* — Cha & Reiter, LLC

(57) ABSTRACT

Provided is an electronic device that may include: an antenna; a duplexer configured to separate a Tx signal that the antenna transmits and an Rx signal that the antenna receives; an amplifier configured to amplify an input signal and to transmit the amplified input signal to the duplexer; a memory storing a digital pre-distortion (DPD) table; a transceiver; and a processor configured to: control the transceiver to transmit, to the amplifier, a first signal in a first frequency band corresponding to the Tx signal; determine whether to perform pre-distortion of the first signal, based on a reception performance of the Rx signal in a second frequency band; perform the pre-distortion of the first signal by making reference to the DPD table configured to decrease a strength of the first signal in the second frequency band; and control the transceiver to transmit the pre-distorted first signal to the amplifier.

20 Claims, 13 Drawing Sheets

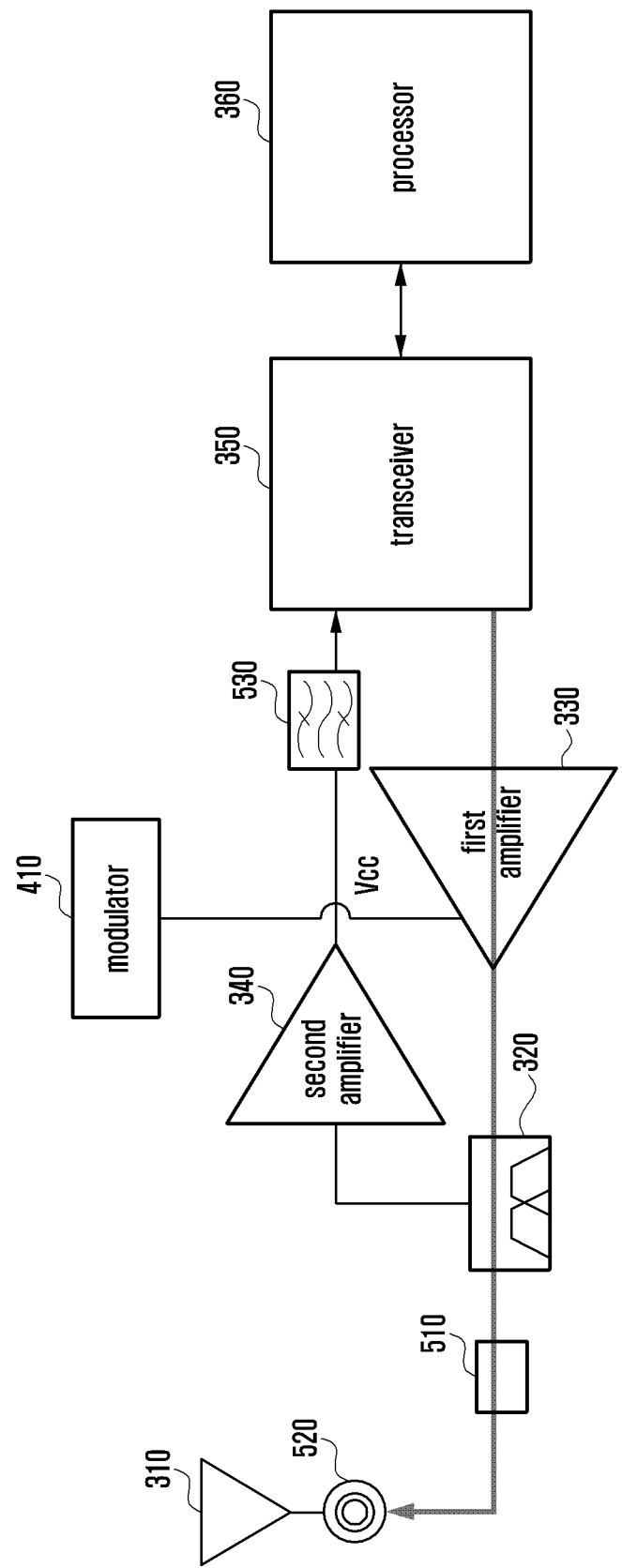

ELECTRONIC DEVICE FOR REDUCING NOISE IN FREQUENCY BAND OF RX SIGNAL AND METHOD FOR THE SAME

CROSS-REFERENCE TO RELATED APPLICATION(S)

This application is based on and claims priority under 35 U.S.C. 119 to Korean Patent Application No. 10-2019-0005256, filed on Jan. 15, 2019, in the Korean Intellectual Property Office, the disclosure of which is herein incorporated by reference in its entirety.

BACKGROUND

1) Field

The instant disclosure generally relates to an electronic device and an operation method of the electronic device, and more particularly, to the technology of decreasing noise of a received signal in a frequency band which may be caused by a transmitted signal.

2) Description of Related Art

Various electronic devices, such as smart phones, tablet PCs, portable multimedia players (PMPs), personal digital assistants (PDAs), laptop personal computers (laptop PCs), wearable devices, etc., have become popular.

These electronic devices may perform communication functions, and may perform transmission or reception of data with other electronic devices. An electronic device may output a signal for communication using an antenna of the electronic device, or may receive a signal transmitted from another electronic device in order to perform the communication.

The frequency band used for transmission of data and the frequency band used for reception of data may be different from each other. Since the frequency band (i.e. transmission channel) used for transmission and the frequency band (i.e. reception channel) used for reception are different from each other, transmission and reception of data may be smoothly performed without interfering with each other. A guard band of a predetermined interval may be disposed between the transmission channel and the reception channel to minimize interference between the transmission channel and the reception channel. By minimizing the interference between the transmission channel and the reception channel, data reception performance and data transmission performance may be optimized.

In addition, in order to prevent interference between the transmission channel and the reception channel, different frequency bands may be used. However, although different frequency bands are used, interference between the transmission channel and the reception channel may exist in reality. For example, a part of a signal used in the transmission channel may overlap a frequency band corresponding to the reception channel.

The above information is presented as background information only to assist with an understanding of the disclosure. No determination has been made, and no assertion is made, as to whether any of the above might be applicable as prior art with regard to the disclosure.

SUMMARY

An aspect of the disclosure is to provide a method for increasing the linearity of the signal outputted for data transmission, in order to prevent interference between the transmission channel and the reception channel.

When the outputted signal is amplified, if the signal's frequency exceeds a predetermined band, linearity may decrease due to saturation. When the linearity decreases, interference between the transmission channel and the reception channel may increase.

If a digital pre-distortion is performed with respect to the signal input to the amplifier, the linearity may be best maintained, even though the signal's frequency exceeds the predetermined frequency band. But when using digital pre-distortion, while the linearity of the signal may be improved, noise of the reception channel caused by the transmission signal corresponding to the transmission channel may not be reduced. Thus, digital pre-distortion may increase transmission performance, but may not prevent deterioration in reception performance.

In accordance with an aspect of the disclosure, an electronic device may include: an antenna; a duplexer electrically connected to the antenna, and configured to separate a Tx signal that the antenna transmits and an Rx signal that the antenna receives based on frequency bands of the Tx signal and the Rx signal; an amplifier electrically connected to the duplexer, and configured to amplify an input signal and to transmit the amplified input signal to the duplexer; a memory storing a digital pre-distortion (DPD) table; a transceiver; and a processor operatively connected to the transceiver and the memory, wherein the processor is configured to: control the transceiver to transmit, to the amplifier, a first signal in a first frequency band which is used for transmission of the Tx signal; determine whether to perform pre-distortion of the first signal, based on a reception performance of the Rx signal in a second frequency band; perform the pre-distortion of the first signal by making reference to the DPD table configured to decrease a strength of the first signal in the second frequency band; and control the transceiver to transmit the pre-distorted first signal to the amplifier.

In accordance with an aspect of the disclosure, an operation method of an electronic device may include: transmitting, by a transceiver, a first signal in a first frequency band which is used for transmission of a Tx signal to an amplifier; determining whether to perform pre-distortion of the first signal, based on a reception performance of an Rx signal in a second frequency band; performing the pre-distortion of the first signal by making reference to a digital pre-distortion (DPD) table configured to decrease a strength of the first signal in the second frequency band; and transmitting, by the transceiver, the pre-distorted first signal to the amplifier.

Additional aspects will be set forth in part in the description which follows and, in part, will be apparent from the description, or may be learned by practice of the presented embodiments.

BRIEF DESCRIPTION OF THE DRAWINGS

For a more complete understanding of the disclosure and its advantages, reference is now made to the following description taken in conjunction with the accompanying drawings, in which like reference numerals represent like parts:

FIG. 5B is a block diagram illustrating another embodiment in which an electronic device extracts a reference signal in order to reduce noise in a frequency band corresponding to an Rx signal;

DETAILED DESCRIPTION

According to certain embodiments, an electronic device and an operation method of the electronic device may analyze a signal provided via a transmission channel, and may control a transceiver and a modem so as to decrease the strength of a signal in a frequency band corresponding to a reception channel, so that noise of the reception channel may be reduced. According to certain embodiments, an electronic device and an operation method of the electronic device may reduce noise of a reception channel, and may increase data reception performance.

According to certain embodiments, an electronic device and an operation method of the electronic device may enable the electronic device that supports communication using a plurality of frequency bands to analyze a signal provided via a transmission channel of a single frequency band, and to control a transceiver so as to decrease the strength of a signal of a frequency band of a reception channel corresponding to another frequency band, so that a data performance of communications in the plurality of frequency bands improves.

Figure 1:
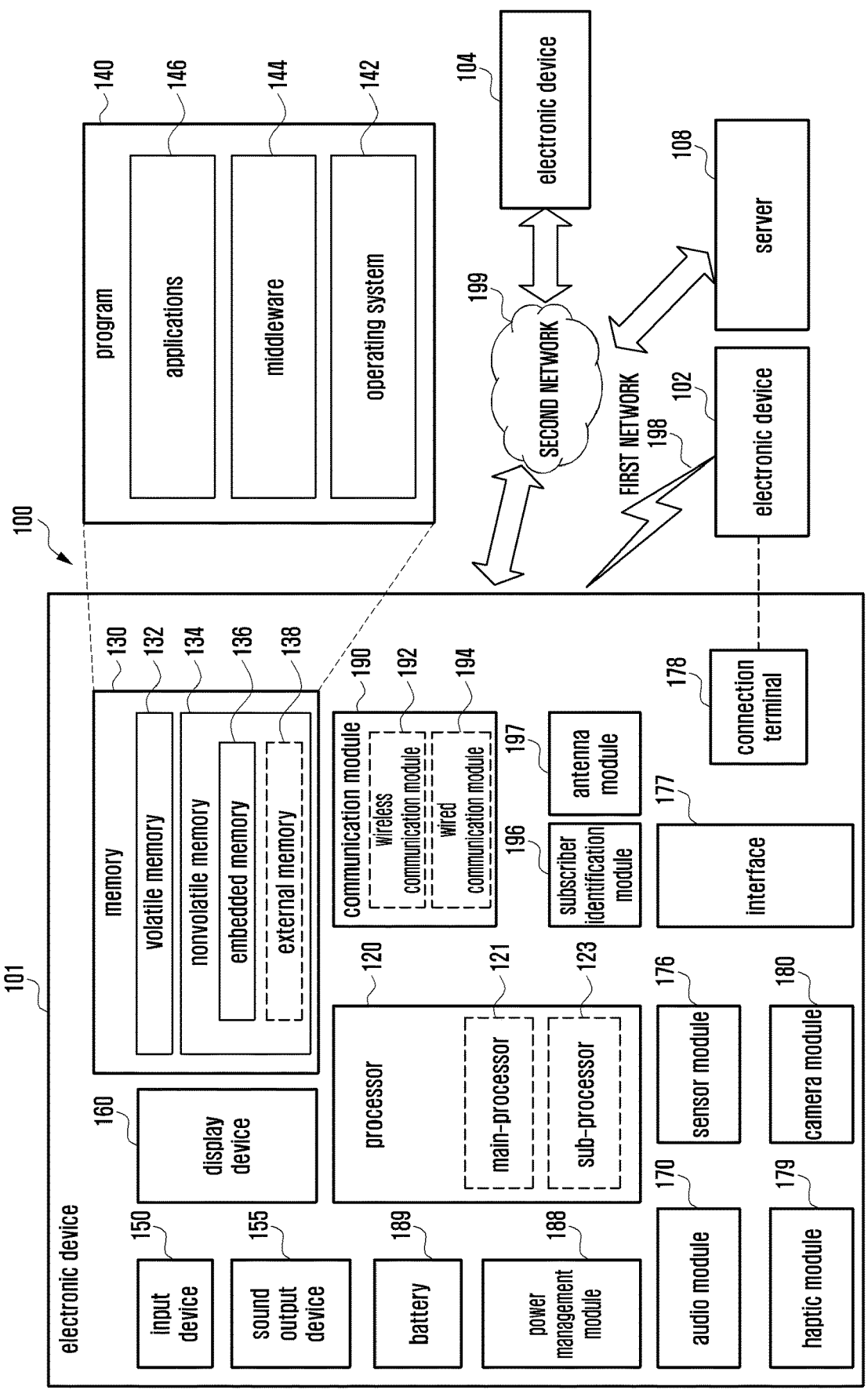
FIG. 1 is a block diagram of an electronic device according to an embodiment.

FIG. 1 is a block diagram illustrating an electronic device 101 in a network environment 100 according to an embodiment. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
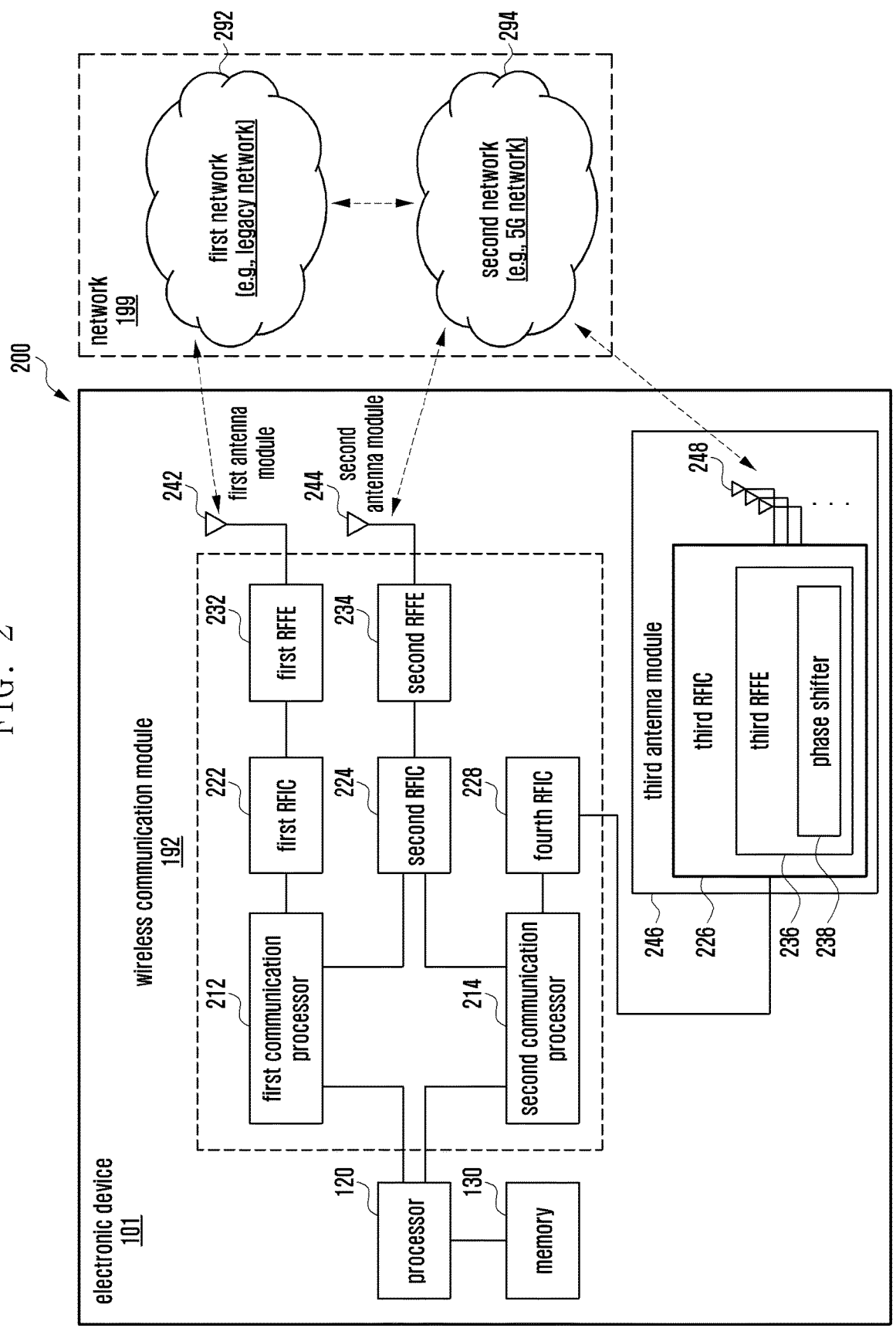
FIG. 2 is a block diagram of an electronic device for supporting legacy network communication and 5G network communication according to an embodiment.

FIG. 2 is a block diagram 200 of an electronic device 101 for supporting legacy network communication and 5G network communication according to an embodiment. Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The network 199 may include a first network 292 and a second network 294. According to another embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may be included as at least a part of the wireless communication module 192. According to another embodiment, the fourth RFIC 228 may be omitted or may be included as a part of the third RFIC 226.

The first communication processor 212 may establish a communication channel of a band to be used for wireless communication with the first network 292, and may support legacy network communication via the established communication channel. According to an embodiment, the first network may be a legacy network including 2G, 3G, 4G, or long term evolution (LTE) network. The second communication processor 214 may establish a communication channel corresponding to a designated band (e.g., approximately 6 GHz to 60 GHz) among bands to be used for wireless communication with the second network 294, and may support 5G network communication via the established channel. According to an embodiment, the second network 294 may be a 5G network defined in 3GPP. Additionally, according to an embodiment, the first communication processor 212 or the second communication processor 214 may establish a communication channel corresponding to another designated band (e.g., lower than 6 GHz) among bands to be used for wireless communication with the second network 294, and may support 5G network communication via the established channel. According to an embodiment, the first communication processor 212 and the second communication processor 214 may be implemented in a single chip or a single package. According to an embodiment, the first communication processor 212 or the second communication processor 214 may be implemented in a single chip or a single package, together with the processor 120, the sub-processor 123, or the communication module 190.

In the case of transmission, the first RFIC 222 may convert a baseband signal generated by the first communication processor 212 into a radio frequency (RF) signal in a range of approximately 700 MHz to 3 GHz used for the first network 292 (e.g., a legacy network). In the case of reception, an RF signal is obtained from the first network 292 (e.g., a legacy network) via an antenna (e.g., the first antenna module 242), and may be preprocessed via an RFFE (e.g., the first RFFE 232). The first RFIC 222 may convert the preprocessed RF signal to a baseband signal so that the base band signal is processed by the first communication processor 212.

In the case of transmission, the second RFIC 224 may convert a baseband signal generated by the first communication processor 212 or the second communication processor 214 into an RF signal (hereinafter, a 5G Sub6 RF signal) of a Sub6 band (e.g., lower than 6 GHz) used for the second network 294 (e.g., 5G network). In the case of reception, a 5G Sub6 RF signal is obtained from the second network 294 (e.g., a 5G network) via an antenna (e.g., the second antenna module 244), and may preprocessed by an RFFE (e.g., the second RFFE 234). The second RFIC 224 may convert the preprocessed 5G Sub6 RF signal into a baseband signal so that the baseband signal is processed by a corresponding communication processor from among the first communication processor 212 or the second communication processor 214.

The third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used for the second network 294 (e.g., 5G network). In the case of reception, a 5G Above6 RF signal is obtained from the second network 294 (e.g., a 5G network) via an antenna (e.g., the antenna 248), and may be preprocessed by the third RFFE 236. The third RFIC 226 may convert the preprocessed 5G Above6 RF signal to a baseband signal so that the base band signal is processed by the second communication processor 214. According to an embodiment, the third RFFE 236 may be implemented as a part of the third RFIC 226.

According to an embodiment, the electronic device 101 may include the fourth RFIC 228, separately from or as a part of the third RFIC 226. In this instance, for transmission of data, the fourth RFIC 228 may convert a baseband signal generated by the second communication processor 214 into an RF signal (hereinafter, an IF signal) in an intermediate frequency band (e.g., approximately 9 GHz to 11 GHz), and may transfer the IF signal to the third RFIC 226. The third RFIC 226 may convert the IF signal to a 5G Above6 RF signal. In the case of reception, a 5G Above6 RF signal is received from the second network 294 (e.g., a 5G network) via an antenna (e.g., the antenna 248), and may be converted into an IF signal by the third RFFE 236. The fourth RFIC 228 may convert the IF signal to a baseband signal so that the base band signal is processed by the second communication processor 214.

According to an embodiment, the first RFIC 222 and the second RFIC 224 may be implemented as a single chip or at least a part of the single package. According to an embodiment, the first RFFE 232 and the second RFFE 234 may be implemented as a single chip or at least a part of the single package. According to an embodiment, at least one antenna module of the first antenna module 242 or the second antenna module 244 may be omitted, or may be combined with another antenna module so as to process RF signals in a plurality of bands.

According to an embodiment, the third RFIC 226 and the antenna 248 may be disposed in the same substrate, and may form the third antenna module 246. For example, the wireless communication module 192 or the processor 120 may be disposed in a first substrate (e.g., main PCB). In this instance, to form the third antenna module 246, the third RFIC 226 is disposed in a part (e.g., a lower part) of the second substrate (e.g., a sub PCB) separate from the first substrate and the antenna 248 is disposed on another part (e.g., an upper part) of the second substrate. By disposing the third RFIC 226 and the antenna 248 in the same substrate, the length of a transmission line therebetween may be reduced. For example, this may reduce a loss (e.g., attenuation) of a signal in a high-frequency band (e.g., approximate 6 GHz to 60 GHz) used for 5G network communication, the loss being caused by a transmission line. Accordingly, the electronic device 101 may improve the quality or speed of communication with the second network 294 (e.g., 5G network).

According to an embodiment, the antenna 248 may be implemented as an antenna array including a plurality of antenna elements which may be used for beamforming. In this instance, the third RFIC 226 may be, for example, a part of the third RFFE 236, and may include a plurality of phase shifters 238 corresponding to a plurality of antenna elements. In the case of transmission, each of the plurality of phase shifters 238 may shift the phase of 5G Above6RF signals so that they can be transmitted from the electronic device 101 via a corresponding antenna element. As an example, the electronic device 401 may be a 5G network base station. In the case of reception, each of the plurality of phase shifters 238 may shift the phase of the 5G Above6 RF signal received from the second network 294 via a corresponding antenna element into the same or substantially the same phase. This may enable transmission or reception via beamforming between the electronic device 101 and the second network 294.

The second network 294 (e.g., 5G network) may operate independently (e.g., Stand-Along (SA)) from the first network 292 (e.g., a legacy network), or may operate by being connected thereto (e.g., Non-Stand Alone (NSA)). For example, in the 5G network, only an access network (e.g., 5G radio access network (RAN) or next generation RAN (NG RAN)) may exist, and a core network (e.g., next generation core (NGC)) may not exist. In this instance, the electronic device 101 may access an access network of the 5G network, and may access an external network (e.g., the Internet) under the control of the core network (e.g., an evolved packed core (EPC)) of the legacy network. Protocol information (e.g., LTE protocol information) for communication with the legacy network or protocol information (e.g., New Radio (NR) protocol information) for communication with the 5G network may be stored in the memory 230, and may be accessed by another component (e.g., the processor 120, the first communication processor 212, or the second communication processor 214).

Figure 3:
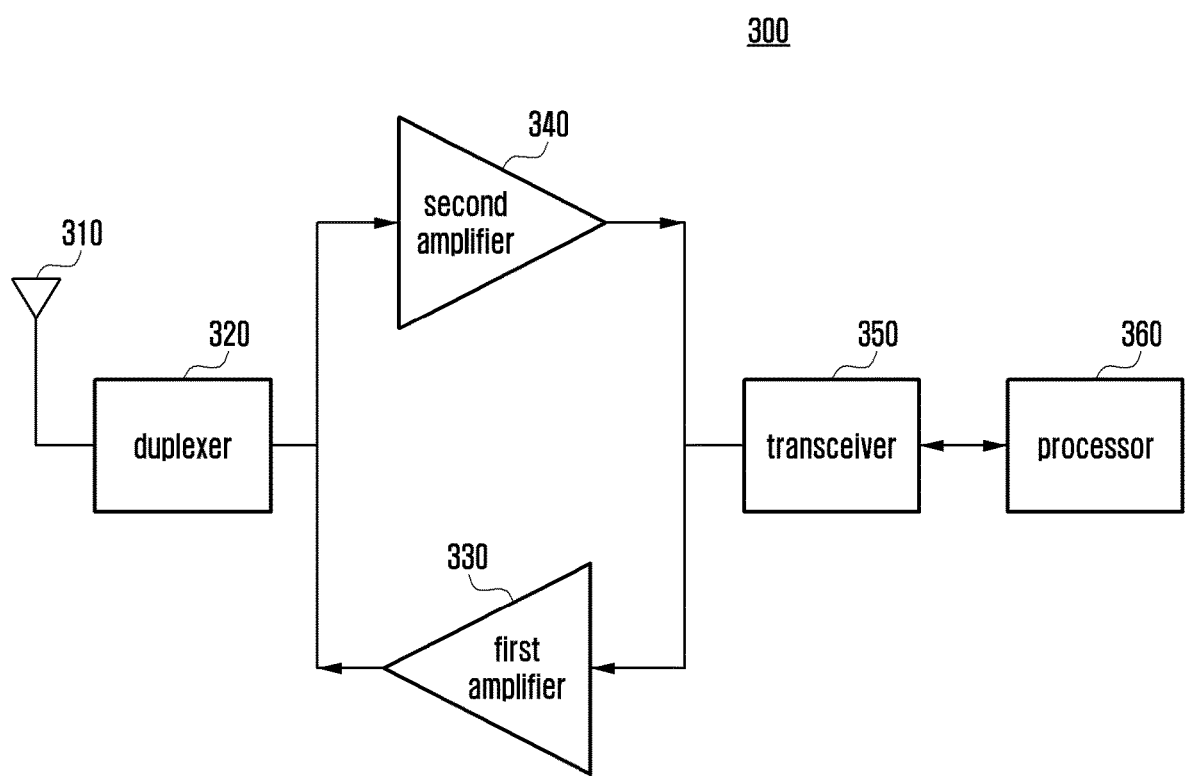
FIG. 3 is a block diagram of an electronic device according to an embodiment.

FIG. 3 is a block diagram of an electronic device according to an embodiment.

Referring to FIG. 3, an electronic device 300 (e.g., the electronic device 101 of FIG. 1) according to an embodiment may include an antenna 310, a duplexer 320, a first amplifier 330, a second amplifier 340, a transceiver 350, and a processor 360. The processor 360 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the antenna 310 may output a Tx signal having a first frequency band, and may receive a Rx signal having a second frequency band. The Tx signal may refer to a signal that the electronic device 300 outputs to the external environment. The Rx signal may refer to a signal that is transmitted from an external electronic device and is received by the electronic device 300. The Tx signal and an Rx signal may include data transmitted or received in a cellular communication network. The cellular communication network may be one of various types of networks. For example, the cellular communication network may be one of 3G communication network, 4G LTE-based communication network, and 5G network. The Tx signal may have the first frequency band, and the Rx signal may have the second frequency band which is different from the first frequency band. Although only a single antenna 310 is illustrated in FIG. 3, a number of antennas may be included in the electronic device 300 depending on the number of frequency bands that the electronic device 300 supports.

According to an embodiment, the duplexer 320 is electrically connected to the antenna 310, and may separate signals input to the duplexer 320 based on the frequency bands of the signal. For example, the duplexer 320 may receive a Tx signal input from the first amplifier 330, and may receive an Rx signal input from the antenna 310. The duplexer 320 may transmit the Tx signal to the antenna 310, and may transmit the Rx signal to the second amplifier 340, depending on the frequency band of the input signal. Although only a single duplexer 320 is illustrated in FIG. 3, a number of duplexers may be included in the electronic device 300 depending on the number of frequency bands that the electronic device 300 supports.

According to an embodiment, the first amplifier 330 may receive a signal transmitted from the transceiver 350, may amplify the received signal, and may transmit the amplified signal to the duplexer 320. The signal received from the transceiver 350 may be the Tx signal described above having the first frequency band. The first amplifier 330 may amplify the signal received from the transceiver 350 according to the control of the processor 360. The first amplifier 330 may amplify the signal using power supplied from a power supply module (not illustrated) connected to the first amplifier 330. The processor 360 may control the first amplifier 330 by controlling the power supply module.

According to an embodiment, the second amplifier 340 may amplify a signal received from the duplexer 320, and may transmit the amplified signal to the transceiver 350. The signal received from the duplexer 320 may be the Rx signal described above having the second frequency band. The second amplifier 340 may be implemented as a low noise amplifier so as to amplify the Rx signal while reducing the noise in the Rx signal.

According to an embodiment, the second amplifier 340 may amplify the signal received from the duplexer 320 according to the control of the processor 360. The second amplifier 340 may amplify the signal using power supplied from a power supply module (not illustrated) connected to the second amplifier 340. The processor 360 may control the second amplifier 340 by controlling the power supply module.

According to an embodiment, the transceiver 350 may control the first amplifier 330, the second amplifier 340, and the antenna 310, so as to transmit or receive signals using the antenna 310 operatively connected to the transceiver 350. Also, the transceiver 350 may process the transmitted or received signals. The transceiver 350 may include various components (e.g., power amplifier, phase shifter, or mixer) in order to process signal amplification, signal phase shift, signal frequency conversion, etc. According to an embodiment, the Tx signal may be transmitted to the first amplifier 330 by the transceiver 350. The Tx signal amplified by the first amplifier 330 may have non-linearity due to the characteristic of the first amplifier 330. The non-linearity of the amplified Tx signal may cause noise in the frequency band of the Rx signal. The noise in Rx band caused by the Tx signal may cause deterioration in the reception performance of the Rx signal.

According to an embodiment, the processor 360 may perform pre-distortion of the Tx signal, based on a predetermined digital pre-distortion (DPD) table, in order to improve the reception performance of the Rx signal. The DPD table may include gain information of various components of the transceiver 350 in order to decrease noise in the Rx band which is caused by the signal amplified by the first amplifier 330. The number of DPD tables is not limited, and if a plurality of DPD tables are implemented, the degree of decrease in noise in the Rx band may be different for each of the plurality of DPD tables.

According to an embodiment, the processor 360 may control the transceiver 350 so that the transceiver 350 transmits a pre-distorted Tx signal to the first amplifier 330. The pre-distorted Tx signal may be amplified by the first amplifier 330. The processor 360 may distort the Tx signal by decreasing the strength of a part of the Tx signal which corresponds to the second frequency band, so as to decrease the noise in the Rx band caused by the Tx signal. Thus, the processor 360 may decrease noise in the Rx band which may be caused by the Tx signal, and may improve the reception performance of the Rx signal of the electronic device 300.

A detailed embodiment associated with generating a DPD table will be described with reference to FIGS. 4A to 4D.

According to an embodiment, the processor 360 may perform pre-distortion of the Tx signal by making reference to a DPD table, in response to detection of various situations that require improvement of reception performance in the second frequency band corresponding to the Rx signal.

According to an embodiment, the processor 360 may identify the strength of a signal received by the antenna 310 in the second frequency band, and if the strength of the signal in the second frequency band is lower than a predetermined value, the processor 360 may determine to perform pre-distortion of the Tx signal.

According to another embodiment, the processor 360 may identify the reception performance of the Rx signal (e.g., the RSSI of the Rx signal), and may determine whether to perform pre-distortion of the Tx signal, based on the result of identifying the reception performance of the Rx signal. For example, the processor 360 may determine to perform pre-distortion of the Tx signal in response to identifying that the reception performance of the Rx signal is less than a predetermined value. The processor 360 may perform pre-distortion of the Tx signal by making reference to a DPD table which is generated to reduce noise in the Rx band caused by the Tx signal.

According to an embodiment, while communication using at least two frequency bands (e.g., transmission of a Tx signal using the first frequency band and transmission of a Tx signal using the second frequency band) is performed, if the reception performance of the Rx signal in the second frequency band is decreased due to the Tx signal in the first frequency band, i.e. when the reception performance of the Rx signal in the second frequency band may be decreased due to noise in the second frequency band increases caused by the Tx signal in the first frequency band, the processor 360 may determine to perform pre-distortion of the Tx signal in the first frequency band.

According to another embodiment, the processor 360 may identify the reception performance of the Rx signal, and may determine that the immediate vicinity of the electronic device 300 corresponds to a low-electric field (e.g. low-electric field strength). The processor 360 may determine whether to perform pre-distortion of the Tx signal, based at least on the result of the identification of the location of the electronic device 300.

According to an embodiment, the pre-distortion of the Tx signal may be referring to an operation of controlling various components included in the transceiver 350 or the processor 360, so as to decrease the strength of the part of the Tx signal in the second frequency band. The processor 360 may control various components, including a mixer and an amplifier which are included in the transceiver 350 or the processor 360.

For example, the processor 360 may change the gain of an In-phase/quadrature (I/Q) signal of the transceiver 350, in order to change the amplitude and phase of the Tx signal, after making reference to the DPD table. The processor 360 may control components (e.g., mixer, modulator, demodulator, or modem) related to the I/Q signal gain, so as to decrease the strength of the part of the Tx signal in the second frequency band.

As another example, the processor 360 may decrease the output of a reference signal, so as to decrease the strength of the part of the Tx signal in the second frequency band. The processor 360 may control an amplifier included in the transceiver 350 so as to decrease the amplification gain value of the amplifier, so that the strength of the part of the Tx signal in the second frequency band is decreased.

According to an embodiment, the processor 360 may control the transceiver 350 after making reference to the DPD table so that a part of the reference signal which corresponds to the second frequency band is decreased to be less than or equal to a predetermined value.

According to an embodiment, the processor 360 may be a communication processor implemented in a communication module (e.g., the communication module 190 of FIG. 1) or may be an application processor (e.g., the processor 120 of FIG. 1). At least two components from among the duplexer 320, the first amplifier 330, the second amplifier 340, the transceiver 350, and the processor 360 may be implemented as one integrated module.

The above-described DPD table may be a table used for improving the reception performance of the Rx signal. According to an embodiment, the DPD table may further include a DPD table for improving the linearity of the Tx signal. The processor 360 may perform digital pre-distortion of a signal input to the first amplifier 330 by making reference to the DPD table for increasing the linearity of the Tx signal, which accordingly will increase the linearity of the signal output from the first amplifier 330. The processor 360 may perform digital pre-distortion of the signal input to the first amplifier 330 by making reference to the DPD table for improving the reception performance of the Rx signal, instead of using the DPD table for improving the linearity of the Tx signal, in response to detection of various situations that require improvement of the reception performance of the second frequency band corresponding to the Rx signal. The various situations that require improvement of the reception performance of the second frequency band will be described with reference to FIG. 7.

Figure 4A:
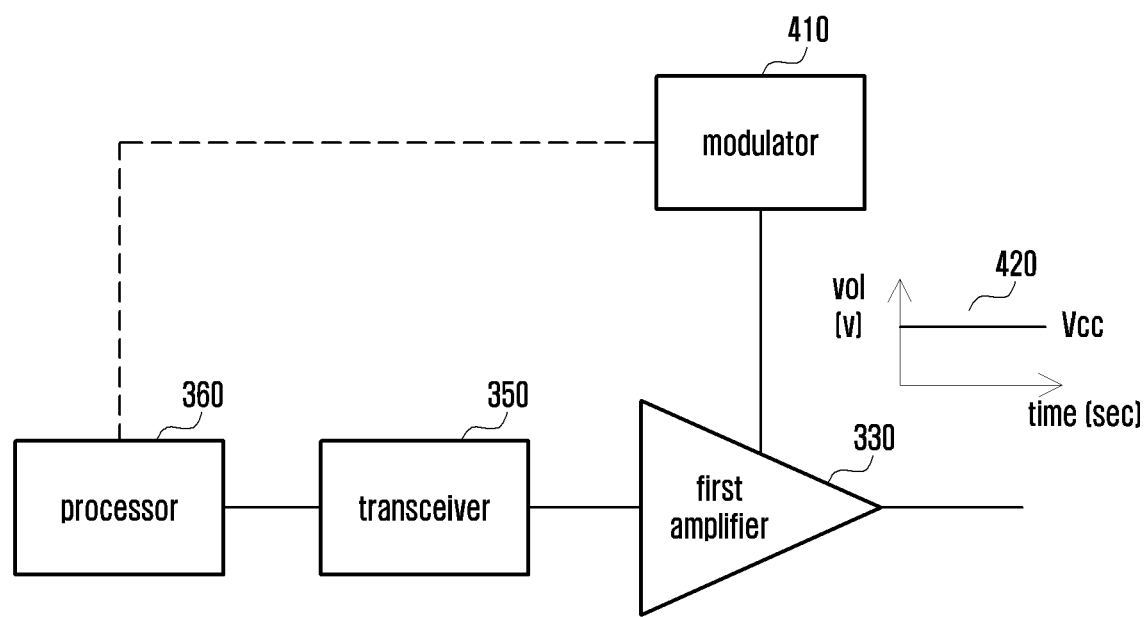
FIG. 4A is a block diagram illustrating an embodiment in which an electronic device generates a DPD table for improving the reception performance of an Rx signal.
Figure 4B:
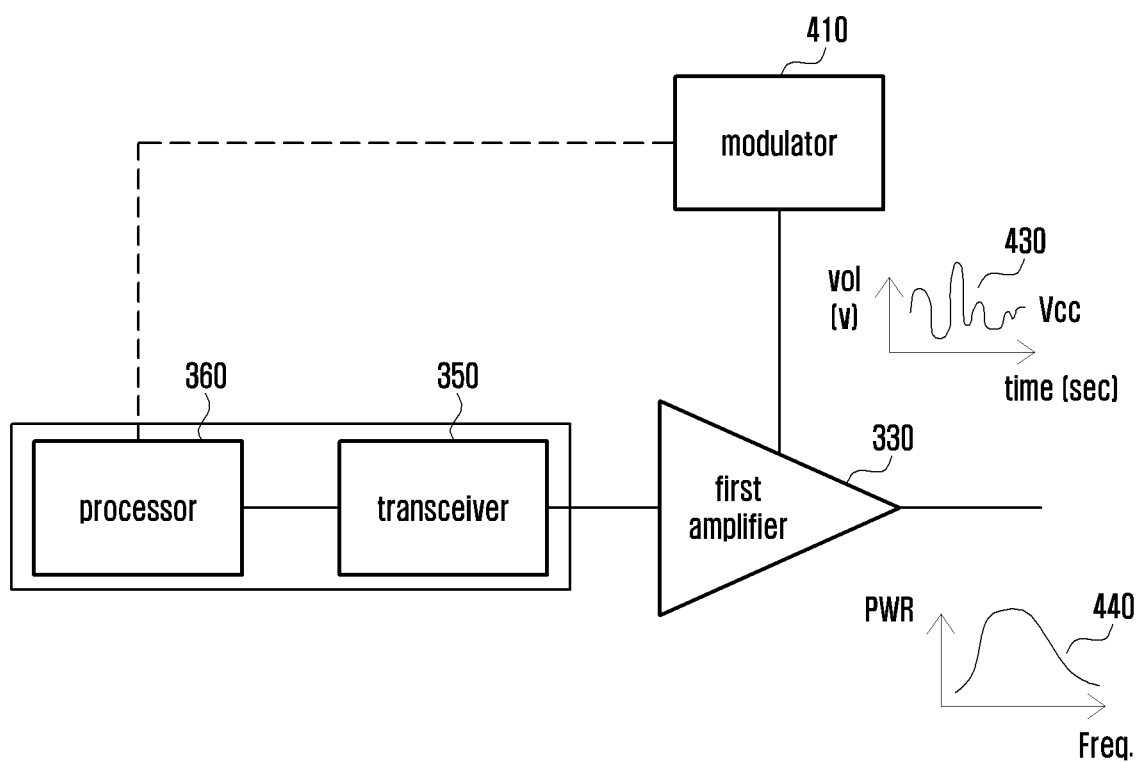
FIG. 4B is another block diagram illustrating the embodiment in which an electronic device generates a DPD table for improving the reception performance of an Rx signal.
Figure 4C:
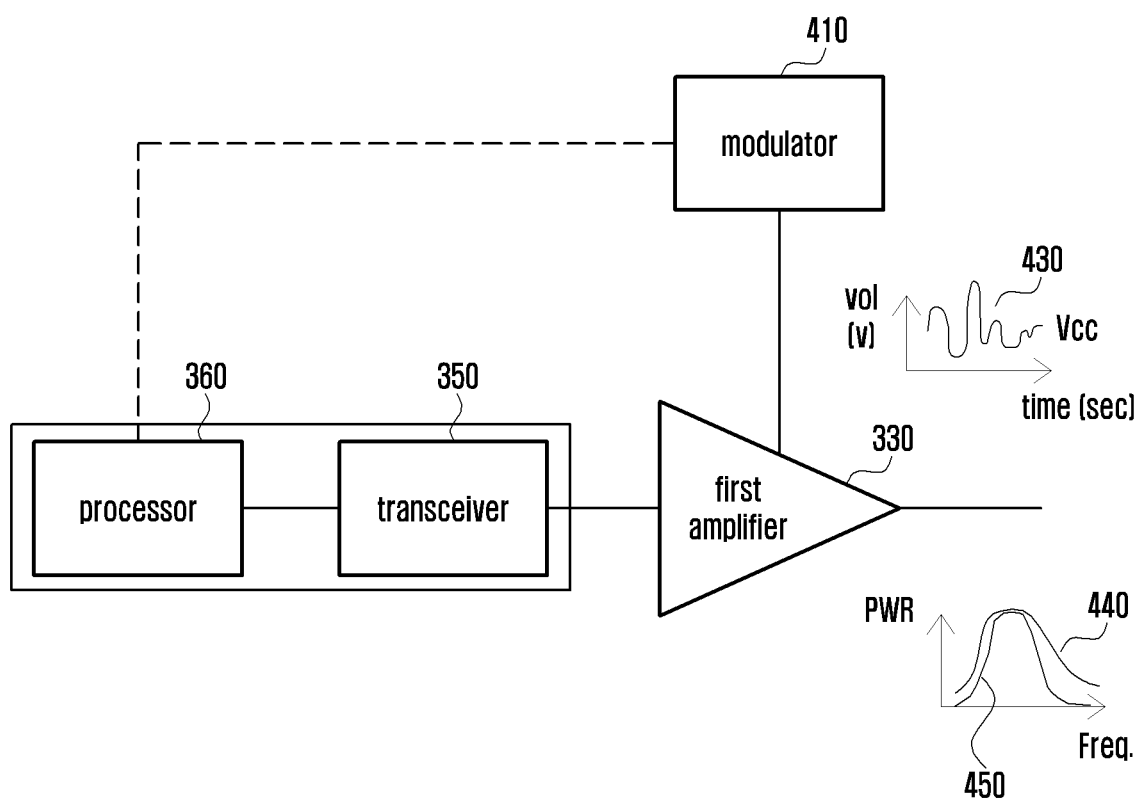
FIG. 4C is yet another block diagram illustrating the embodiment in which an electronic device generates a DPD table for improving the reception performance of an Rx signal.
Figure 4D:
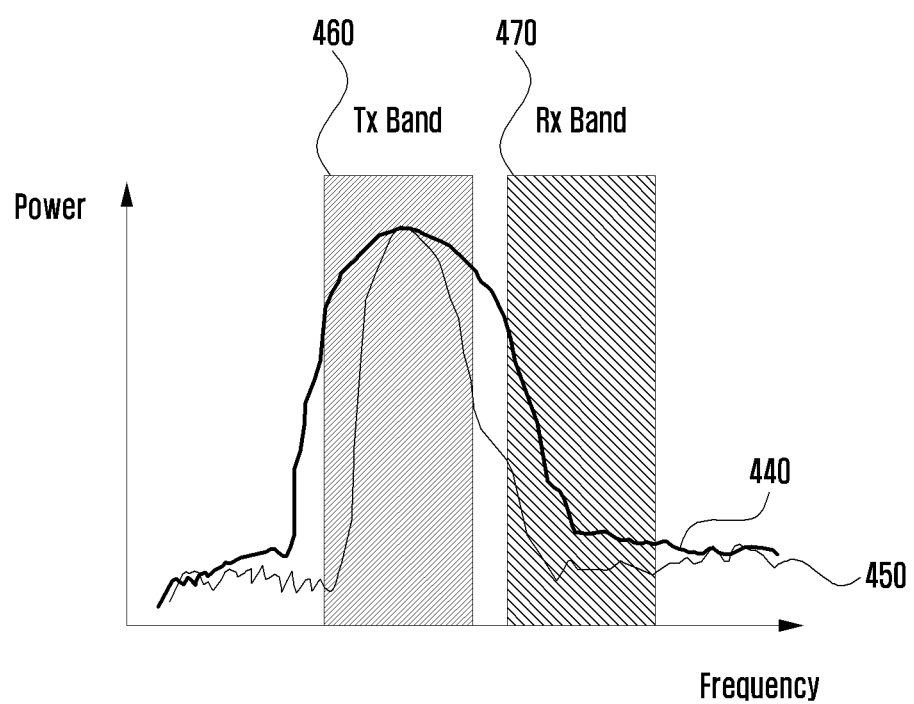
FIG. 4D is a diagram illustrating strength of a reference signal in a frequency band, and strength of a reference signal which is pre-distorted by the electronic device 300 using a DPD table for improving the reception performance of an Rx signal, according to an embodiment.

FIG. 4A is a block diagram illustrating an embodiment in which an electronic device generates a DPD table for improving the reception performance of an Rx signal, FIG. 4B is another block diagram illustrating the embodiment in which an electronic device generates a DPD table for improving the reception performance of an Rx signal, FIG. 4C is a yet another block diagram illustrating the embodiment in which an electronic device generates a DPD table for improving the reception performance of an Rx signal, and FIG. 4D is a diagram illustrating strength of a reference signal in a frequency band, and strength of a reference signal which is pre-distorted by the electronic device 300 using a DPD table for improving the reception performance of an Rx signal, according to an embodiment.

A description of the components which have been described in FIG. 3 is omitted in the description of FIGS. 4A to 4D for the sake of simplicity.

FIG. 4A illustrates an embodiment of extracting a reference signal. Referring to FIG. 4A, the electronic device 300 according to an embodiment may extract a reference signal in order to generate a DPD table for reducing noise in a second frequency band which is caused by a Tx signal corresponding to a first frequency band.

According to an embodiment, the electronic device 300 may input a reference signal to a first amplifier (e.g., the first amplifier 330 of FIG. 3), and may extract a part of the reference signal amplified by the first amplifier 330. To this end, the processor 360 may control the transceiver 350 in order to transmit the reference signal to the first amplifier 330.

According to an embodiment, a power modulator 410 is electrically connected to the processor 360, and may modulate power 420 supplied to the first amplifier 330 based on the control of the processor 360. For example, the power modulator 410 may modulate the power 420 supplied to the first amplifier 330 by changing the magnitude of the power 420 or the frequency of the power 420 supplied to the first amplifier 330.

FIG. 4B illustrate an operation of analyzing, by the electronic device 300, the characteristics of a reference signal using the power modulator 410, according to an embodiment.

According to an embodiment, the power modulator 410 may modulate the power 420 supplied to the first amplifier 330 in order to change the characteristic of a reference signal including the amplitude of the reference signal and the frequency of the reference signal. The power modulator 410 may provide various modes for tracking the reference signal amplified by the first amplifier 330. For example, the power modulator 410 may track the amplified reference signal using an envelope tracking mode (EP mode) or an average power tracking mode (APT mode). The envelope tracking mode tracks the envelope of the amplified reference signal in real time, and supplies power to the first amplifier 330 based on an instantaneous amplitude information of the signal (including real-time change in the envelope). Thus, the envelope tracking mode refers to a mode of supplying power to the first amplifier 330 according to the envelope of the tracked signal.

According to an embodiment, the power modulator 410 may perform an operation of changing the frequency of the reference signal (e.g., increasing the frequency of the reference signal) via modulation 430 of power supplied to the first amplifier 330. A reference signal 440 of which the frequency is changed is illustrated in FIG. 4B.

According to an embodiment, the processor 360 may identify the characteristics of the reference signal 440. For example, the processor may determine the frequency band of the reference signal 440.

FIG. 4C illustrates an embodiment in which the electronic device 300 generates a DPD table based on identification of the strength 440 of the reference signal according to an embodiment.

Referring to FIG. 4C, the electronic device 300 may identify the strength 440 of the reference signal after its frequency is changed. For example, the electronic device 300 may identify the strength 440 of the reference signal in a second frequency band which is the frequency band of an Rx signal. The electronic device 300 may control various components included in the transceiver 350 or the processor 360 so that the strength 440 of the reference signal in the second frequency band is less than a predetermined value.

According to an embodiment, the electronic device 300 may control the transceiver 350 or the processor 360 so that the strength 440 of the reference signal in the second frequency band is less than a predetermined value, by adjusting at least one of an I/Q signal gain value of a modem, a gain value of a mixer, a gain value of a driver, and a gain value of an amplifier included in the transceiver 350 or the processor 360.

For example, the electronic device 300 may change the gain of an In-phase/quadrature (I/Q) signal of the transceiver 350, in order to change the amplifier and phase of the reference signal. The processor 360 may control components (e.g., mixer, modulator, demodulator, or a modem) related to an I/Q signal gain, so as to decrease the strength of the extracted signal (e.g. the extracted part of the reference signal) in the second frequency band 470 shown in FIG. 4D. In this instance, the strength of the reference signal in the first frequency band 460 may also be partially decreased.

As another example, the electronic device 300 may decrease the output of the reference signal, so as to decrease the strength of the extracted signal in the second frequency band 470. The electronic device 300 may control the amplifier included in the transceiver 350 to decrease the amplification gain value of the amplifier, so that the strength of the extracted signal in the second frequency band 470 is decreased. In this instance, the strength of the reference signal in the first frequency band 460 may also be partially decreased.

According to an embodiment, the electronic device 300 may generate a DPD table including set values of various components (e.g., modem, mixer, driver, or amplifier) included in the transceiver 350 or the processor 360 which decrease the strength 440 of the reference signal in the second frequency band to be less than a predetermined value. Table 1 provided below shows an example of a DPD table.

TABLE 1

| Item | Value |
|---|---|
| Modem I Signal[mV] | 100 |
| Modem Q Signal[mV] | 150 |
| RFIC Mixer Gain[dB] | 10 |
| RFIC Drive AMP Gain[dB] | 15 |
| PA VCC[V] | 4 |
| . . . | . . . |

According to an embodiment, the predetermined value may be variable, and the electronic device 300 may change the predetermined value based on the reception performance of an Rx signal and may generate another DPD table. The generating another DPD table may include modifying the DPD table by changing the predetermined value based on the reception performance of an Rx signal.

According to an embodiment, the electronic device 300 may perform the above-described operations so as to generate a DPD table with respect to a channel corresponding to the center frequency of a plurality of channels included in the frequency band of a reference signal, and may perform channel bandwidth delay calibration with respect to the other channels, and may correct the DPD table according to the result of the channel bandwidth delay calibration, as opposed to performing the above-described operations, so as to generate the DPD table for each of the plurality of channel.

FIG. 4D illustrates the strength 440 of a reference signal in a frequency band, and the strength 450 of a reference signal which is pre-distorted by the electronic device 300 using a DPD table for improving the reception performance of an Rx signal, according to an embodiment.

FIG. 4D illustrates the strength 440 of the reference signal which is not pre-distorted based on the DPD table for improving the reception performance of the Rx signal, and the strength 450 of the reference signal which is pre-distorted using the DPD table. As shown, the strength 450 of the reference signal which is pre-distorted is decreased compared to the strength 440 of the reference signal, which is not pre-distorted using the DPD table, in the second frequency band 470. The fact that the strength 450 of the reference signal is decreased in the second frequency band 470 may indicate that noise in the second frequency band 470 is decreased.

Figure 5A:
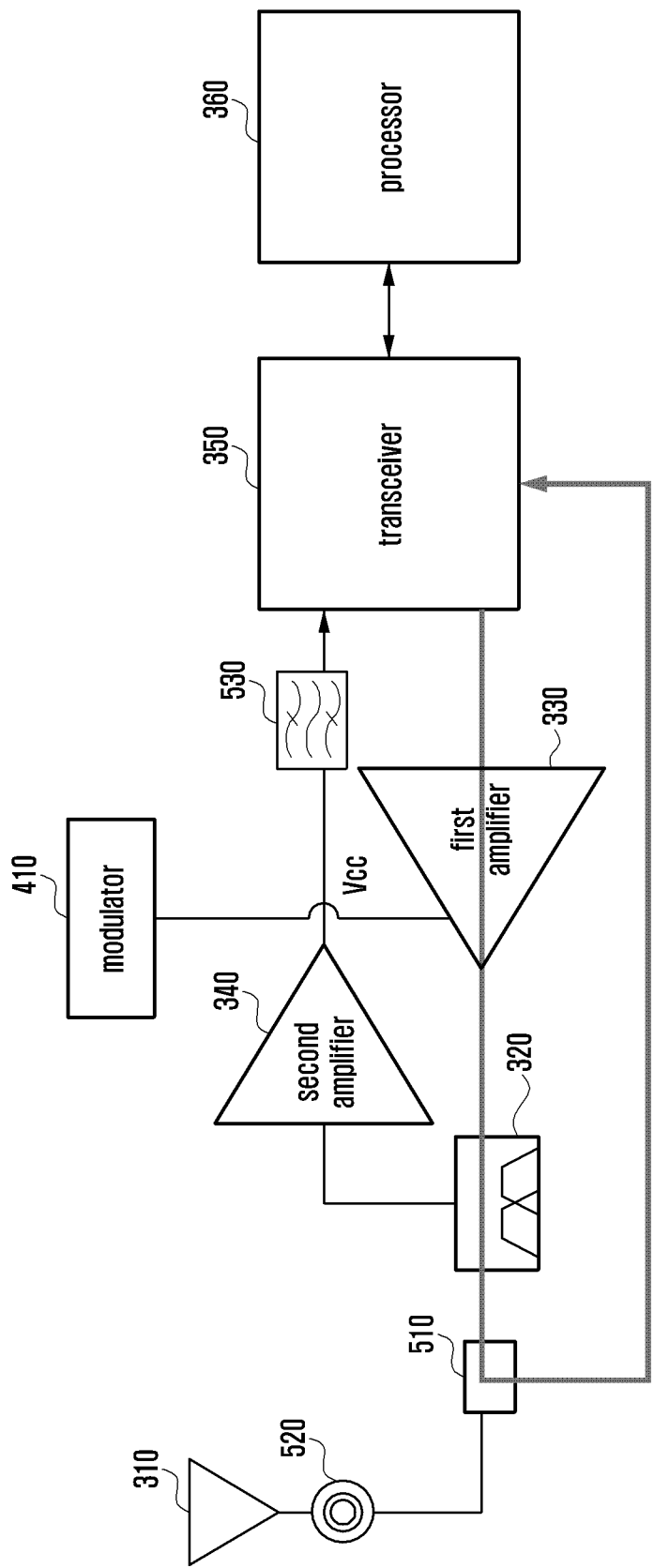
FIG. 5A is a block diagram illustrating an embodiment in which an electronic device extracts a reference signal in order to reduce noise in a frequency band corresponding to an Rx signal.
Figure 5C:
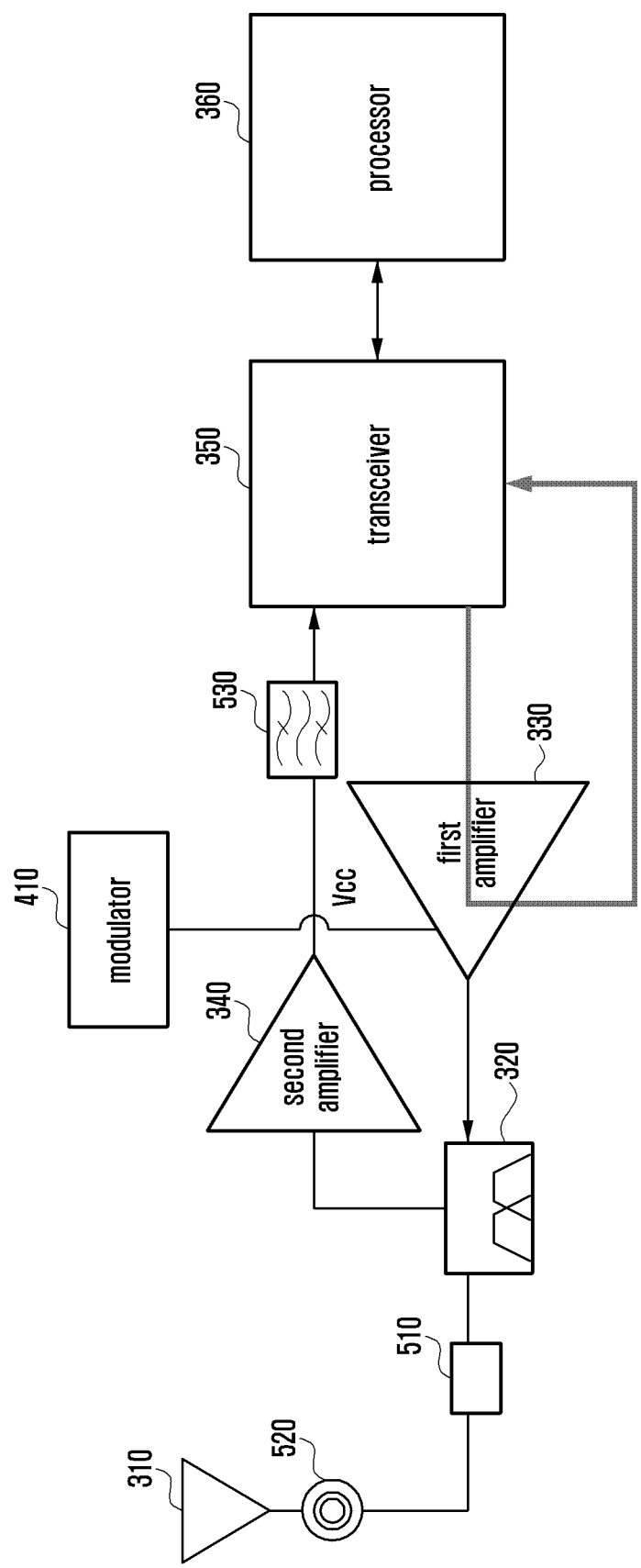
FIG. 5C is a block diagram illustrating still another embodiment in which an electronic device extracts a reference signal in order to reduce noise in a frequency band corresponding to an Rx signal.

FIG. 5A is a block diagram illustrating an embodiment in which an electronic device extracts a reference signal in order to reduce noise in a frequency band corresponding to an Rx signal, FIG. 5B is a block diagram illustrating another embodiment in which an electronic device extracts a reference signal in order to reduce noise in a frequency band corresponding to an Rx signal, and FIG. 5C is a block diagram illustrating still another embodiment in which an electronic device extracts a reference signal in order to reduce noise in a frequency band corresponding to an Rx signal.

A description of the components which have been described in FIG. 3 and FIGS. 4A to 4D is omitted in the descriptions of FIGS. 5A to 5C for simplicity.

Referring to FIGS. 5A to 5C, the electronic device 300 may further include a connector 520 and a coupler 510 between an antenna (e.g., the antenna 310 of FIG. 3) and a duplexer (e.g., the duplexer of FIG. 3). The electronic device 300 may further include an SAW filter 530 between the second amplifier 340 and the transceiver 350. The SAW filter 530 may filter only a partial signal corresponding to a predetermined frequency band in the RX signal amplified by the second amplifier 340, and may transmit the filtered signal to the transceiver 350.

According to an embodiment, the coupler 510 may generate a signal which is coupled to the Tx signal transferred to the antenna 310 for emission. The connector 520 may be disposed between the coupler 510 and the antenna 310, and may electrically connect the coupler 510 and the antenna 310.

Referring to FIG. 5A, the electronic device 300 may extract a signal that is generated when a reference signal amplified by the first amplifier 330 passes through the coupler 510. The electronic device 300 may receive the signal generated when the reference signal passes through the coupler 510, and may analyze the received signal. The electronic device 300 may control the components included in the transceiver 350 or the processor 360 based on the result of the analysis, and may generate a DPD table using the set values of the components.

Referring to FIG. 5B, the electronic device 300 may extract a signal that is generated when a reference signal amplified by the first amplifier 330 passes through the duplexer 320 and the coupler 510, prior to the signal being transferred to the antenna 310. According to the embodiment illustrated in FIG. 5B, a signal may be extracted by a separate external measuring device (e.g., a call box) which is wiredly or wirelessly connected to the electronic device 300. The external measuring device may identify the strength of a measured signal in the second frequency band, and may transmit the result of identification to the electronic device 300. The electronic device 300 may control the components included in the transceiver 350 or the processor 360 based on the result of the identification, and may generate a DPD table using the set values of the components.

Referring to FIG. 5C, the electronic device 300 may extract a signal which corresponds to the reference signal amplified by the first amplifier 330, prior to the signal passing through the duplexer 320. The electronic device 300 may analyze the extracted signal, may control the components included in the transceiver 350 or the processor 360 based on the result of the analysis, and may generate a DPD table using the set values of the components.

Figure 6:
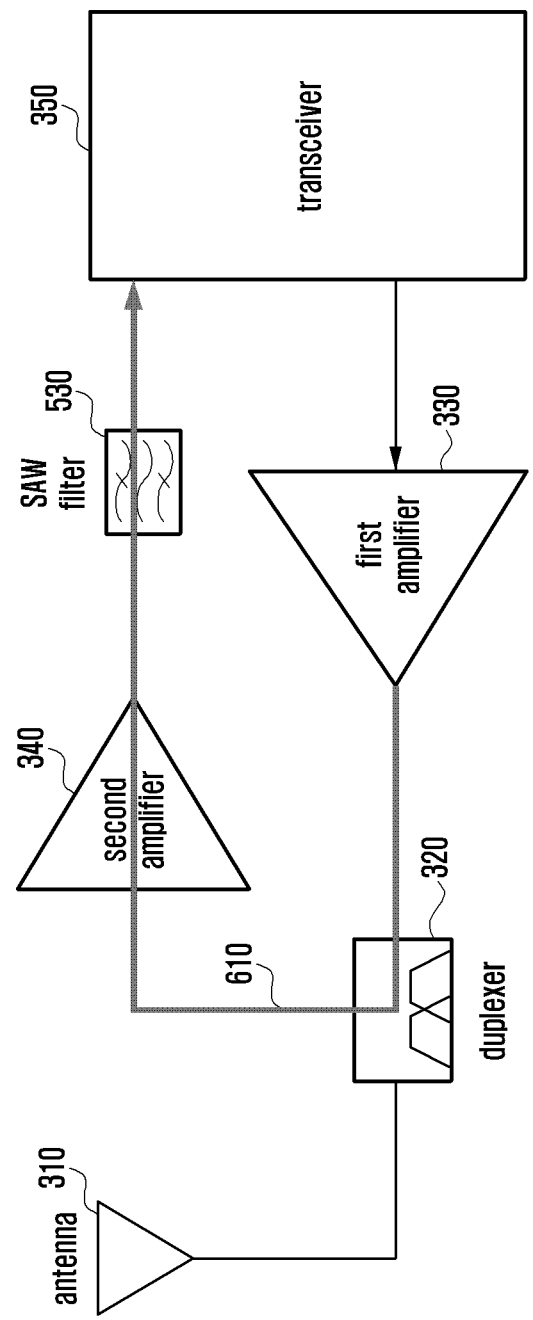
FIG. 6 is a block diagram illustrating an embodiment in which an electronic device decreases noise in a frequency band corresponding to an Rx signal.

FIG. 6 is a block diagram illustrating an embodiment in which an electronic device decreases noise in a frequency band corresponding to an Rx signal.

Referring to FIG. 6, an electronic device (e.g., the electronic device 300 of FIG. 3) according to an embodiment may include the antenna 310, the duplexer 320, the first amplifier 330, the second amplifier 340, the SAW filter 530, and the transceiver 350.

According to an embodiment, the electronic device 300 may control the transceiver 350 so as to transmit a signal including data to the first amplifier 330. The transceiver 350 may control the first amplifier 330 so that the first amplifier 330 amplifies the signal. The signal amplified by the first amplifier 330 may be filtered by the duplexer 320, and may be emitted via the antenna 310.

According to an embodiment, a part 610 of the signal amplified by the first amplifier 330 may be transmitted to a path for receiving an Rx signal (e.g., a path in which the Rx signal is transmitted to the transceiver 350 via the second amplifier 340 and the SAW filter 530). The part 610 of the signal amplified by the first amplifier 330 may be transmitted to an Rx port of the transceiver 350, and may deteriorate the reception performance of the Rx signal.

According to an embodiment, the electronic device 300 may perform pre-distortion of the signal including the data, using a DPD table, in order to decrease the strength of a partial signal which corresponds to the frequency band (e.g., the second frequency band) corresponding to the Rx signal in the signal amplified by the first amplifier 330. The DPD table may be a table used for improving the reception performance of the Rx signal. The electronic device 300 may decrease the strength of a part of the Tx signal transferred to the Rx port of the transceiver 350, by performing pre-distortion using the DPD table for improving the reception performance of an Rx signal, and may prevent decrease in the reception performance of the Rx signal caused by the Tx signal.

Figure 7:
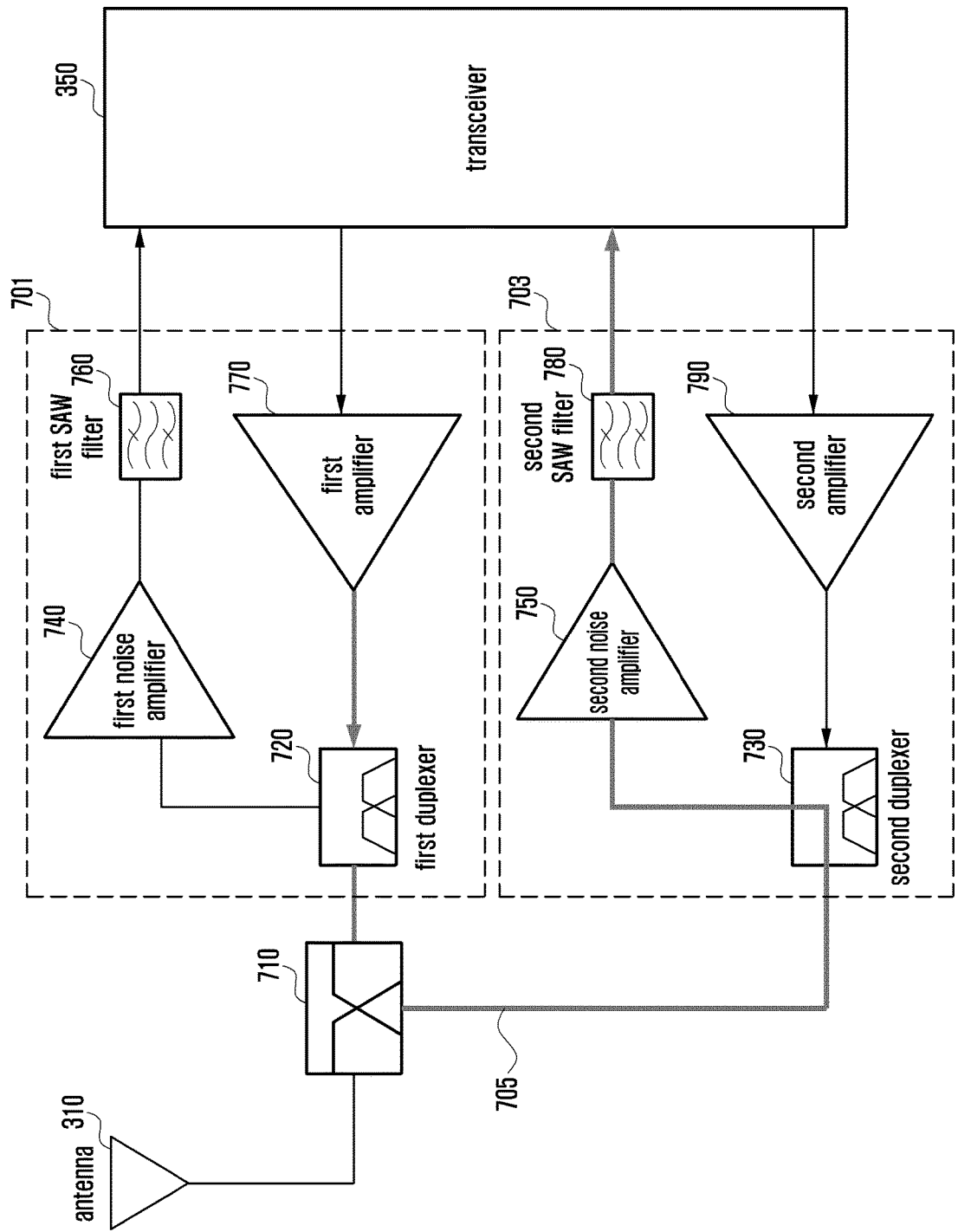
FIG. 7 is a block diagram illustrating an embodiment in which an electronic device decreases noise in a frequency band corresponding to an Rx signal, where the electronic device supports communication in a plurality of frequency bands.

FIG. 7 is a block diagram illustrating an embodiment in which an electronic device decreases noise in a frequency band corresponding to an Rx signal, where the electronic device supports communication in a plurality of frequency bands.

Referring to FIG. 7, the electronic device 300 according to an embodiment may support data communication in a plurality of frequency bands. For example, the electronic device 300 may support carrier aggregation in the 4G data communication, Wi-Fi bonding using all of the adjacent frequency bands, 4G cellular communication (4G-LTE), and 5G cellular communication.

According to an embodiment, the electronic device 300 may include transmission paths and reception paths which respectively correspond to the supported frequency bands to perform transmission or reception of signals of the plurality of frequency bands.

In the example shown in FIG. 7, the electronic device 300 supports two frequency bands (e.g., B3 and B8), and transmission paths and reception paths respectively corresponding to two frequency bands are illustrated in FIG. 7. The transmission path and the reception path corresponding to frequency band B8 are indicated by a broken line 701, and the transmission path and the reception path corresponding to frequency band B3 are indicated by a broken line 703. However, the disclosure is not so limited, and other frequency bands may also be supported.

According to an embodiment, each of the two frequency bands may be separated into a frequency band for a signal to be transmitted and a frequency band for a signal to be received.

According to an embodiment, the electronic device 300 may include the antenna 310, a diplexer 710, a first duplexer 720, a second duplexer 730, a first low noise amplifier 740, a second low noise amplifier 750, a first SAW filter 760, a first amplifier 770, a second SAW filter 770, a second amplifier 790, and a transceiver 350.

According to an embodiment, the antenna 310 may transmit or receive signals corresponding to two frequency bands B3 and B8.

According to an embodiment, the diplexer 710 may transmit a signal via a reception path corresponding to the frequency band of a signal received via the antenna 310. For example, if the frequency band of the signal received via the antenna 310 is B3, the diplexer 710 may transmit the signal via a reception path corresponding to frequency band B3 (e.g., a path connected via the second duplexer 730, the second low noise amplifier 750, and the second SAW filter 780). As another example, if the frequency band of a signal received via the antenna 310 is B8, the diplexer 710 may transmit the signal via a reception path corresponding to frequency band B8 (e.g., a path connected via the first duplexer 720, the first low noise amplifier 740, and the first SAW filter 760).

According to an embodiment, the first duplexer 720, the first low noise amplifier 740, the first SAW filter 760, and the first amplifier 770 may process a signal corresponding to band B8. The detailed functions thereof may be the same as those of the components which have been described with reference to FIG. 3.

According to an embodiment, the second duplexer 730, the second low noise amplifier 750, the second SAW filter 780, and the second amplifier 790 may process a signal corresponding to band B3. The detailed functions thereof may be the same as those of the components which have been described with reference to FIG. 3.

According to an embodiment, the electronic device 300 may control the transceiver 350 so as to transmit a signal including data to the first amplifier 770, in order to transmit data via frequency band B8. The transceiver 350 may control the first amplifier 770 so that the first amplifier 770 amplifies a signal. The signal amplified by the first amplifier 770 may be filtered by the first duplexer 720 and the diplexer 710, and may be emitted via the antenna 310.

According to an embodiment, a part 705 of the signal amplified by the first amplifier 770 may be transmitted via a path for receiving an Rx signal having frequency band B3 (a path in which the Rx signal having frequency band B3 is transmitted via the diplexer 710, the second duplexer 730, the second low noise amplifier 750, and the second SAW filter 780). The part 705 of the signal amplified by the first amplifier 770 may be transmitted to an Rx port of the transceiver 350, and may deteriorate the reception performance of the Rx signal.

According to an embodiment, the electronic device 300 may detect that the reception performance of the RX signal having frequency band B3 is decreased, and may determine to perform pre-distortion of the Tx signal in the frequency band B8. The electronic device 300 may perform the pre-distortion by changing set values of various components included in the transceiver 350 after making reference to a DPD table.

According to an embodiment, the electronic device 300 may perform pre-distortion of the Tx signal in the frequency band B8 so as to decrease the strength of the partial signal which corresponds to the frequency band of the Rx signal having frequency band B3. The strength of the Tx signal having frequency band B8, which is transferred to an Rx port of the transceiver 350, is decreased by the pre-distortion, and deterioration in the reception performance of the Rx signal having frequency band B3 caused by the Tx signal having frequency band B8 may be prevented.

An electronic device according to an embodiment may include: an antenna; a duplexer electrically connected to the antenna, and configured to separate a Tx signal that the antenna transmits and an Rx signal that the antenna receives based on frequency bands of the Tx signal and the Rx signal; an amplifier electrically connected to the duplexer, and configured to amplify an input signal and to transmit the amplified input signal to the duplexer; a memory storing a digital pre-distortion (DPD) table; a transceiver; and a processor operatively connected to the transceiver and the memory, wherein the processor is configured to: control the transceiver to transmit, to the amplifier, a first signal in a first frequency band which is used for transmission of the Tx signal; determine whether to perform pre-distortion of the first signal, based on a reception performance of the Rx signal in a second frequency band; perform the pre-distortion of the first signal by making reference to the DPD table configured to decrease the strength of the first signal in the second frequency band; and control the transceiver to transmit the pre-distorted first signal to the amplifier.

In the electronic device according to an embodiment, the processor may be configured to control internal components of the transceiver, based on values corresponding to the internal components included in the DPD table.

In the electronic device according to an embodiment, the processor may be configured to: analyze the first signal amplified by the amplifier; and determine whether to perform the pre-distortion of the first signal, based on the strength of the amplified first signal in the second frequency band.

In the electronic device according to an embodiment, the processor may be configured to: identify whether the strength of the received signal in the second frequency band exceeds a predetermined value; and to perform the pre-distortion of the first signal when the strength of the first signal in the second frequency band exceeds the predetermined value.

In the electronic device according to an embodiment, the processor may be configured to control the transceiver to decrease the strength of the first signal in the second frequency band to be less than or equal to the predetermined value.

In the electronic device according to an embodiment, the processor may be configured to: control the transceiver to output a reference signal used for generating the DPD table to the amplifier; receive the reference signal amplified by the amplifier; identify the strength of the received reference signal in the second frequency band; control a plurality of components included in the transceiver to decrease the strength of the received reference signal in the second frequency band to be less than a predetermined value, based on the identified strength of the received signal; identify values for each of the plurality of components; and generate the DPD table based on the values.

In the electronic device according to an embodiment, the processor may be configured to receive the amplified reference signal before the amplified reference signal is transferred to the duplexer.

In the electronic device according to an embodiment, the processor may be configured to receive the amplified reference signal after the amplified reference signal is transferred to the duplexer.

In the electronic device according to an embodiment, the electronic device may further include a coupler connected between the duplexer and the antenna, and the processor may be configured to receive the amplified reference signal the coupler.

In the electronic device according to an embodiment, the processor may be configured to: perform pre-distortion of the first signal, based on another DPD table for increasing a linearity of the Tx signal; and determine whether to perform the pre-distortion based on the DPD table or the other DPD table, based on the reception performance of the Rx signal.

Figure 8:
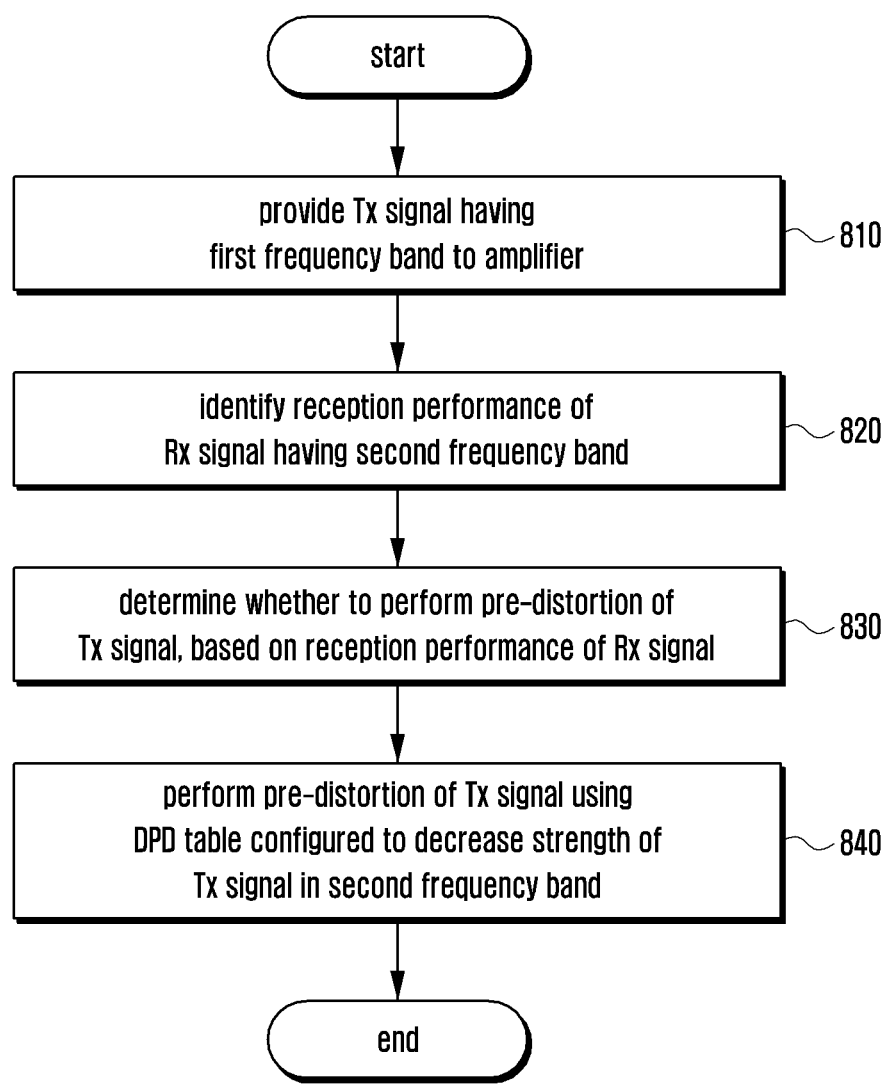
FIG. 8 is a flowchart illustrating an operation method of an electronic device according to an embodiment.

FIG. 8 is a flowchart illustrating an operation method of an electronic device according to an embodiment.

Referring to FIG. 8, in operation 810 of the operation method of an electronic device according to an embodiment, an electronic device (e.g., the electronic device 300 of FIG. 3) may control a transceiver (e.g., the transceiver 350 of FIG. 3) so as to provide a Tx signal having a first frequency band to a first amplifier (e.g., the first amplifier 330 of FIG. 3).

According to an embodiment, the transceiver 350 may provide the Tx signal to the first amplifier 330, and may control the first amplifier 330 to amplify the Tx signal.

According to an embodiment, in operation 820, the electronic device 300 may identify the reception performance of an Rx signal having a second frequency band.

According to an embodiment, the reception performance of the Rx signal may be identified using various indications including the received signal strength indication (RSSI) or the received signal code power of the Rx signal.

According to an embodiment, in operation 830, the electronic device 300 may determine whether to perform pre-distortion of the Tx signal, based on the reception performance of the Rx signal.

According to an embodiment, the pre-distortion of the Tx signal may be performed in order to improve the reception performance of the Rx signal.

According to an embodiment, in operation 840, the electronic device 300 may perform pre-distortion of the Tx signal using a digital pre-distortion (DPD) table which is configured to decrease the strength of the Tx signal in the second frequency band.

According to an embodiment, the DPD table may include gain information of various components of the transceiver 350 in order to decrease noise in the Rx band which is caused by the signal amplified by the first amplifier 330. The number of DPD tables is not limited, and if a plurality of DPD tables are implemented, the degree of decrease in noise in the Rx band is different for each of the plurality of DPD tables.

According to an embodiment, the electronic device 300 may control the transceiver 350 so that the transceiver 350 transmits the pre-distorted Tx signal to the first amplifier 330. The pre-distorted Tx signal may be amplified by the first amplifier 330. The electronic device 300 may perform pre-distortion of the Tx signal by decreasing a part of the Tx signal which corresponds to the second frequency band, so as to decrease noise in the Rx band which is caused by the Tx signal. The electronic device 300 may decrease noise in the Rx band which may be caused by the Tx signal, and may improve the reception performance of the Rx signal of the electronic device 300. The electronic device 300 may perform pre-distortion of the Tx signal using a DPD table, and may reduce noise in the Rx band. The detailed embodiment associated with generating a DPD table has been described with reference to FIGS. 4A to 4D. An operation method of an electronic device according to an embodiment may include: transmitting, by a transceiver, a first signal in a first frequency band which is used for transmission of a Tx signal to an amplifier; determining whether to perform pre-distortion of the first signal, based on a reception performance of an Rx signal in a second frequency band; performing the pre-distortion of the first signal by making reference to a digital pre-distortion (DPD) table configured to decrease the strength of the first signal in the second frequency band; and transmitting, by the transceiver, the pre-distorted first signal to the amplifier.

In the operation method of an electronic device according to an embodiment, the operation of performing the pre-distortion of the first signal may include controlling internal components of the transceiver, based on values corresponding to the internal components included in the DPD table.

In the operation method of an electronic device according to an embodiment, the operation of determining whether to perform the pre-distortion of the first signal may include: analyzing the first signal amplified by the amplifier; and determining whether to perform the pre-distortion of the first signal, based on the strength of the amplified first signal in the second frequency band.

In the operation method of an electronic device according to an embodiment, the operation of determining whether to perform the pre-distortion of the first signal may further include: identifying whether the strength of the received signal in the second frequency band exceeds a predetermined value; and performing the pre-distortion of the first signal when the strength of the first signal in the second frequency band exceeds the predetermined value.

In the operation method of an electronic device according to an embodiment, the operation of performing the pre-distortion of the first signal may include controlling the transceiver to decrease the strength of the first signal in the second frequency band to be less than or equal to the predetermined value.

The operation method of an electronic device according to an embodiment may further include: controlling the transceiver to output a reference signal used for generating the DPD table to the amplifier; receiving the reference signal amplified by the amplifier; identifying the strength of the received reference signal in the second frequency band; controlling a plurality of components included in the transceiver to decrease the strength of the received reference signal in the second frequency band to be less than a predetermined value, based on the identified strength of the received reference signal; identifying values for each of the plurality of components; and generating the DPD table based on the values.

In the operation method of an electronic device according to an embodiment, the operation of receiving of the reference signal may include receiving the amplified reference signal before the amplified reference signal is transferred to a duplexer.

In the operation method of an electronic device according to an embodiment, the operation of receiving the reference signal may include receiving the amplified reference signal after the amplified reference signal is transferred to the duplexer.

In the operation method of an electronic device according to an embodiment, the operation of receiving the reference signal may include receiving the amplified reference signal using a coupler connected between the duplexer and an antenna.

The operation method of an electronic device according to an embodiment may further include: performing the pre-distortion of the first signal, based on another DPD table for increasing a linearity of the Tx signal; and determining whether to perform the pre-distortion based on the DPD table or the other DPD table, based on the reception performance of the Rx signal.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:
1. An electronic device, comprising:
an antenna;
a duplexer electrically connected to the antenna, and configured to separate a Tx signal that the antenna transmits and an Rx signal that the antenna receives based on frequency bands of the Tx signal and the Rx signal;
an amplifier electrically connected to the duplexer, and configured to amplify an input signal and to transmit the amplified input signal to the duplexer;
a memory storing a digital pre-distortion (DPD) table;
a transceiver; and
a processor operatively connected to the transceiver and the memory,
wherein the processor is configured to:
control the transceiver to transmit, to the amplifier, a first signal in a first frequency band which is used for transmission of the Tx signal;
determine whether to perform pre-distortion of the first signal, based on a reception performance of the Rx signal in a second frequency band;
perform the pre-distortion of the first signal by making reference to the DPD table configured to decrease a strength of the first signal in the second frequency band; and
control the transceiver to transmit the pre-distorted first signal to the amplifier.

2. The electronic device of claim 1, wherein the processor is configured to control internal components of the transceiver based on values corresponding to the internal components included in the DPD table.

3. The electronic device of claim 1, wherein the processor is configured to:
analyze the first signal amplified by the amplifier; and
determine whether to perform the pre-distortion of the first signal, based on a strength of the amplified first signal in the second frequency band.

4. The electronic device of claim 3, wherein the processor is configured to:
identify whether the strength of the first signal in the second frequency band exceeds a predetermined value; and
perform the pre-distortion of the first signal when the strength of the first signal in the second frequency band exceeds the predetermined value.

5. The electronic device of claim 4, wherein the processor is configured to control the transceiver to decrease the strength of the first signal in the second frequency band to be less than or equal to the predetermined value.

6. The electronic device of claim 1, wherein the processor is configured to:
control the transceiver to output a reference signal used for generating the DPD table to the amplifier;
receive the reference signal amplified by the amplifier;
identify a strength of the received reference signal in the second frequency band;
control a plurality of components included in the transceiver to decrease the strength of the received reference signal in the second frequency band to be less than a predetermined value, based on the identified strength of the received reference signal;
identify values for each of the plurality of components; and
generate the DPD table based on the values.

7. The electronic device of claim 6, wherein the processor is configured to receive the amplified reference signal before the amplified reference signal is transferred to the duplexer.

8. The electronic device of claim 6, wherein the processor is configured to receive the amplified reference signal after the amplified reference signal is transferred to the duplexer.

9. The electronic device of claim 8, wherein the electronic device further comprises a coupler connected between the duplexer and the antenna, and
wherein the processor is configured to receive the amplified reference signal using the coupler.

10. The electronic device of claim 1, wherein the processor is configured to:
perform the pre-distortion of the first signal, based on another DPD table for increasing a linearity of the Tx signal; and
determine whether to perform the pre-distortion based on the DPD table or the other DPD table, based on the reception performance of the Rx signal.

11. An operation method of an electronic device, the method comprising:
transmitting, by a transceiver to an amplifier, a first signal in a first frequency band which is used for transmission of a Tx signal;
determining whether to perform pre-distortion of the first signal, based on a reception performance of an Rx signal in a second frequency band;
performing the pre-distortion of the first signal by making reference to a digital pre-distortion (DPD) table configured to decrease a strength of the first signal in the second frequency band; and
transmitting, by the transceiver, the pre-distorted first signal to the amplifier.

12. The method of claim 11, wherein the performing the pre-distortion of the first signal comprises:
controlling internal components of the transceiver, based on values corresponding to the internal components included in the DPD table.

13. The method of claim 11, wherein the determining whether to perform the pre-distortion of the first signal comprises:
analyzing the first signal amplified by the amplifier; and
determining whether to perform the pre-distortion of the first signal, based on a strength of the amplified first signal in the second frequency band.

14. The method of claim 13, wherein the determining whether to perform the pre-distortion of the first signal further comprises:
identifying whether the strength of the first signal in the second frequency band exceeds a predetermined value; and
performing the pre-distortion of the first signal when the strength of the first signal in the second frequency band exceeds the predetermined value.

15. The method of claim 14, wherein the performing the pre-distortion of the first signal comprises: controlling the transceiver to decrease the strength of the first signal in the second frequency band to be less than or equal to the predetermined value.

16. The method of claim 11, further comprising:
controlling the transceiver to output a reference signal used for generating the DPD table to the amplifier;
receiving the reference signal amplified by the amplifier;
identifying a strength of the received reference signal in the second frequency band;
controlling a plurality of components included in the transceiver to decrease the strength of the received reference signal in the second frequency band to be less than a predetermined value, based on the identified strength of the received reference signal;
identifying values for each of the plurality of components; and
generating the DPD table based on the values.

17. The method of claim 16, wherein the receiving of the reference signal comprises:
receiving the amplified reference signal before the amplified reference signal is transferred to a duplexer.

18. The method of claim 16, wherein the receiving the reference signal comprises:
receiving the amplified reference signal after the amplified reference signal is transferred to a duplexer.

19. The operation method of claim 18, wherein the receiving the reference signal comprises:
receiving the amplified reference signal using a coupler connected between the duplexer and an antenna.

20. The method of claim 11, further comprising:
performing the pre-distortion of the first signal, based on another DPD table for increasing a linearity of the Tx signal; and
determining whether to perform the pre-distortion based on the DPD table or the other DPD table, based on the reception performance of the Rx signal.

* * * * *